United States Patent Office 3,418,125

Patented Dec. 24, 1968

3,418,125

PROCESS FOR PREPARING DIRECT-POSITIVE IMAGES WITH PHOTODEVELOPABLE DIRECT-PRINT SILVER HALIDE COMPOSITIONS

Edward A. Sutherns, Harrow, England, assignor to Eastman Kodak Company, Rochester, N.Y., a corporation of New Jersey No Drawing. Filed Aug. 20, 1964, Ser. No. 391,002
7 Claims. (Cl. 96—64)

ABSTRACT OF THE DISCLOSURE

A photographic process for preparing direct-positive images with a photographic element containing a layer of a photodevelopable, direct-print silver halide composition. The process comprises (1) imagewise exposing said composition to a low intensity light, (2) uniformly exposing the resulting imagewise exposed composition to short duration high intensity light, and (3) thereafter uniformly exposing the resulting exposed silver halide composition to light of lower intensity than the second said exposure to effect photodevelopment of a positive image.

The present invention relates to a process for exposing photographic photodevelopable, direct-print silver halide compositions.

Photodevelopable, direct-print silver halide compositions are well known in the art. Photographic elements containing such compositions are particularly useful for "light-writing" and oscillographic recording when used with oscillographs of the type described in Heiland, U.S. Patent 2,580,427, for example. With oscillographs, the photodevelopable, direct-print compositions are exposed to traces of short-duration, high-intensity light, and thereafter photodeveloped to an image in the regions of exposure by a uniform or over-all exposure to light of lower intensity than the initial short-duration, high-intensity exposure. Such a process is a negative process as the image occurs in the areas of exposure. Such silver halide emulsions and the processing thereof are to be distinguished from conventional developing out compositions that are processed chemically to form visible images, and print-out silver halide compositions that form visible images on exposure without development.

It is an object of this invention to provide a novel method for exposing photographic photodevelopable, direct-print silver halide compositions.

It is another object of this invention to provide a novel direct-positive or reversal process.

It is also an object of this invention to provide a new dry process for preparing reversal images.

These and other objects of the invention are accomplished by subjecting photographic elements containing a photodevelopable, direct-print silver halide layer to three successive exposures, the first exposure being an imagewise exposure to relatively low-intensity light, the second exposure being a uniform exposure to light of relatively short duration and high intensity, and the third exposure being a uniform exposure to light of lower intensity than the second exposure to effect photodevelopment of a positive image.

The first exposure of the present process is an imagewise exposure to relatively low-intensity light. Generally this exposure is at least about .1 foot-candle second at an intensity of less than about 100 foot-candle second at an intensity of less than about 100 foot-candles, and preferably about 200 to 2,000 foot-candle seconds at an intensity of less than 100 foot-candles. A wide range of light sources can be utilized including conventional fluorescent light, tungsten light or sources rich in ultraviolet light. In general, light sources suitable for conventional photodevelopment of photodevelopable, direct-print silver halide after exposure to a short-duration, high-intensity light with an oscillograph can be utilized. Elevated temperatures of generally at least about 90° C. during this first or imagewise exposure are useful for improving the image-background discrimination of the direct-positive image resulting from the present process.

The second exposure of the present process is a uniform or over-all exposure of the image-exposed element to light of relatively short duration and high intensity. Generally, this second exposure is at least about .1 foot-candle second and preferably at an intensity of more than 100 foot-candles. This second exposure is typically merely a flash from a high intensity source of the type utilized for "light-writing" such as those utilized in oscillographs. Illustrative suitable light sources include mercury vapor lamps that have high blue and ultraviolet emission, xenon lamps that emit light of wavelengths similar to daylight, and tungsten lamps that have high red light emission.

The third exposure of the present process is a uniform or over-all exposure of the high-intensity-exposed element to light of lower intensity than the second exposure. Generally this third exposure is at least about .0001 foot-candle second and preferably at an intensity of about 10 to 2,000 foot-candles. The third exposure is sufficient to effect photodevelopment of a positive image, to wit, areas not exposed by the first or imagewise exposure are photodeveloped to visible images. Light sources of the general type used for the first exposure can be utilized for the third exposure. Elevated temperatures of generally at least about 90° C. during the third exposure are useful for improving the image-background discrimination.

The first exposure of the present process can be considered a modulating or "setting" exposure in which the exposed areas (negative image areas) receive a small but sufficient exposure to "set" its photodeveloping-out characteristics. The photodeveloping-out characteristics of this exposed area are not substantially altered by the short-duration, high-intensity light of the second exposure of the present process. Thus, the usual modulating effect of the short-duration, high-intensity light exposure is suppressed in the negative image areas by the first "setting" exposure. For a given first exposure or imagewise exposure that is sufficient to "set" the light-sensitive element as described above, the final background will be lower, the weaker the intensity of light used for this first exposure. Hence, exposure conditions for the first exposure are a compromise between optimum image-background discrimination and time desired for making the direct-positive photographic copy.

Light sources for the three exposures of the present process are utilized that emit radiant energy to which the photodevelopable, direct-print silver halide layers used in the process of the invention are sensitive. Such silver halides can be spectrally sensitized to extend their inherent sensitivities with sensitizing dyes as described in the copending applications of Fix and Jones, U.S. Ser. Nos. 303,137 and 303,180, filed Aug. 19, 1963, now abandoned. Merocyanine dyes are described in these applications are particularly useful.

After carrying out the three-exposure process described above, a direct-positive or reversal silver image results. If archival-quality records are desired, photographic elements processed as described above can be chemically developed and fixed in accordance with known processes for treating photodevelopable, direct-print silver halide emulsions. The present process can be utilized to make positive prints from positive microfilms in reader-printer type of apparatus, to make proofs of any positive transparency, for direct documentary copying by contact exposure and for a wide variety of related uses.

A wide variety of light-developable, direct-print photographic silver halide compositions can be processed in accordance with the present invention, such being well-known to those skilled in the present art. Suitable silver halides include silver chloride, silver bromide, silver bromoiodide, silver chloroiodide, silver chlorobromide, and silver chlorobromoiodide. Silver halides that are predominantly silver bromide are preferred. For a description of suitable silver halide emulsions, reference is made to Davey et al., U.S. Patent 2,592,250, issued Apr. 8, 1952; Glafkides, Photographic Chemistry, vol. 1, pp. 31–2, Fountain Press, London; and McBride application, Ser. No. 222,964, filed Sept. 11, 1962, now abandoned, wherein is disclosed the preparation of silver halide emulsions with organic thioether silver halide solvents present during the grain growth of the silver halide. Generally about .1 to 25 g. of such thioethers per mole of silver halide is used. Typical of such thioethers are 3,6-dithia-1,8-octanediol, 1,10 - dithia - 4,7,13,16-tetraoxacyclooctadecane, 7,10 - diaza-1,16-dicarboxamido-3,14-dithiahexadecane - 6,11-dione, and 1,17-di-(N-ethylcarbamyl)-6,12-dithia-9-oxaheptadecane.

Water-soluble lead salts are preferably present during the grain growth of the silver halide compositions processed in accordance with the invention to form silver-lead halide grains which preferably contain about .01 to 5 mole percent lead based on the silver.

The so-called "internal image" silver halide compositions are used in the invention, such having silver halide grains wherein a predominant amount of the sensitivity to radiation is internal to the grains. Such internal image silver halide compositions are those which, when measured according to normal photographic techniques by coating a test portion of the composition on a transparent support, exposing to a light intensity scale having a fixed time between $1 \times 10^{-6}$ and 1 second, bleaching 5 minutes in a 0.3% potassium ferricyanide solution at 65° F. and developing for about 5 minutes at 65° F. in Developer B below (an "internal-type" developer), have a sensitivity, measured at a density of 0.1 above fog, greater than the sensitivity of an identical test portion which has been exposed in the same way and developed for 6 minutes at 68° F. in Developer A below (a "surface-type" developer).

| Developer A | Grams |
|---|---|
| N-methyl-p-aminophenol sulfate | 0.31 |
| Sodium sulfite, dessicated | 39.60 |
| Hydroquinone | 6.00 |
| Sodium carbonate, desiccated | 18.70 |
| Potassium bromide | 0.86 |
| Citric acid | 0.68 |
| Potassium metabisulfite | 1.50 |
| Water to make 1 liter. | |

| Developer B | |
|---|---|
| N-methyl-p-aminophenol sulfate | 2.0 |
| Sodium sulfite, desiccated | 90.0 |
| Hydroquinone | 8.0 |
| Sodium carbonate, monohydrate | 52.5 |
| Potassium bromide | 5.0 |
| Sodium thiosulfate | 10.0 |
| Water to make 1 liter. | |

Such silver halide compositions generally have an average grain size of about .1 to 10 microns, and more generally about .5 to 1 micron.

A useful method for preparing the silver halide used in the invention is by the "conversion" method as described. In accordance with the "conversion" method of making silver halide, silver halide more water-soluble than silver-bromide (e.g., silver chloride or a silver chlorobromide) is formed in an acidic aqueous medium by mixing a water-soluble salt of silver and a water-soluble halide, the mixing time not being critical, with mixing times ranging from 15 seconds to 3 hours being typical. The pH of the acidic aqueous ripening medium is preferably less than 4 and can be as low as 2. The resulting silver halide is converted to a silver halide containing the bromide moiety in the presence of a water-soluble thiocyanate and a water-soluble bromide containing halide. Conversion conditions are preferably chosen which favor ripening, and the temperature is typically maintained at an elevated temperature of at least 60° C. and preferably from 65° to 85° C. The water-soluble thiocyanate is added to the aqueous acidic medium at any stage up to, or during the conversion of the grains. The conversion to the silver bromide is more generally effected over a period of from 10 minutes to 2 hours. The means projective area of the silver halide grains of such compositions is generally between about .6 and 2.5 square microns, such silver halide being characterized as "coarse-grained."

The silver halide of the light-sensitive compositions processed in accordance with the invention desirably contains at least about 70 mole percent of bromide and is preferably silver bromide, a silver bromoiodide or a mixture of these. When iodide is present, it is preferred that the amount not to exceed 6 percent of the weight of the halide, with an amount less than a maximum of 1 percent being preferred. If chloride is present in the halide, this is preferably not in excess of about 30 mole percent.

Cuprous iodide can be utilized in combination with the silver halide and can be added to the silver halide as a powder, as a suspension in a liquid such as water or an aqueous dispersion of a colloidal binder, or as a solution in a solvent such as acetonitrile, for example. Instead of pure solid cuprous iodide, a solid solution of cuprous iodide in another salt, silver iodide for example, can be added. It is preferred for the cuprous iodide to be added to the silver halide at a concentration of between 3 and 100 grams of cuprous iodide per mole of silver halide. Lower or higher concentrations have useful effects, however. The cuprous iodide addendum is particularly useful for improving the photodevelopment, direct-print properties such as discrimination between image and background areas. After the cuprous iodide and the silver halide have been mixed, and preferably before coating, it can be advantageous to hold the mixture at an elevated temperature, 30–70° C. being typical, or as high as 200° C. being suitable.

Reference is made to the disclosures in the copending application of Sutherns and Hirsch, U.S. Ser. No. 376,-246, filed June 18, 1964, for suitable photographic elements that can be utilized in the process of the invention, and which disclosures include photographic elements containing cuprous iodide and the "conversion" method described above.

A wide variety of hydrophilic, water-permeable organic colloids can be suitably utilized in preparing silver halide emulsions or dispersions processed in accordance with the invention. Gelatin is preferably utilized although other colloidal material such as colloidal albumin, cellulose derivatives, synthetic resins or the like can be utilized. Suitable colloids that can be used are polyvinyl alcohol or a hydrolyzed polyvinyl acetate as described in Lowe, U.S. Patent 2,286,215, issued June 16, 1942; a far hydrolyzed cellulose ester such as cellulose acetate hydrolyzed to an acetyl content of 19 to 26% as described in U.S. Patent 2,327,808 of Lowe and Clark, issued Aug. 24, 1943; a water-soluble ethanolamine cellulose acetate as described in Yutzy, U.S. Patent 2,322,085, issued June 15, 1943; a polyacrylamide having a combined acrylamide content of 30 to 60% and a specific viscosity of 0.25 to 1.5 on an imidized polyacrylamide of like acrylamide content and viscosity as described in Lowe, Minsk and Kenyon, U.S. Patent 2,541,474, issued Feb. 13, 1951; zein as described in Lowe, U.S. Patent 2,563,791, issued Aug. 7, 1951; a vinyl alcohol polymer containing urethane carboxylic acid groups of the type described in Unruh and Smith, U.S. Patent 2,768,154, issued Oct. 23, 1956; or containing cyanoacetyl groups such as the vinyl alcohol-vinyl cyanoacetate copolymer as described in Unruh, Smith and Priest, U.S. Patent 2,808,331, issued Oct. 1, 1957; or a polymeric material which results from polymerizing a protein or a saturated acylated protein with a monomer having a vinyl group as described in Illingsworth, Dann and Gates, U.S. Patent 2,852,382, issued Sept. 19, 1958.

The photographic silver halide compositions processed in accordance with the invention can contain the addends generally utilized in such products including halogen acceptors, gelatin hardeners, gelatin plasticizers, coating aids and the like.

Such silver halide compositions can be coated as layers on a wide variety of supports in accordance with usual practice. Typical supports for photographic elements of the invention include paper, cellulose nitrate film, cellulose acetate film, polyvinyl acetal film, polystyrene film, polyethyleneterephthalate film, polyethylene-coated paper, and related films of resinous materials and others.

The invention is further illustrated by the following examples of preferred embodiments thereof.

EXAMPLE 1

A photodevelopable, direct-print, light-sensitive gelatino silver chlorobromide emulsion (95% bromide, 5% chloride) having sliver halide grains of high internal sensitivity was prepared by slowly adding an aqueous solution of silver nitrate containing about .85 gram of lead nitrate per mole of silver to an aqueous gelatin solution containing a stoichiometric excess of potassium chloride and potassium bromide to provide a large-grain emulsion, a small amount of an organic thioether silver halide solvent of the type described in McBride application, U.S. Ser. No. 222,964 filed Sept. 11, 1962, such as .5 gram of 1,8-dihydroxy-3,6-dithiaoctane per mole of silver, also being added during the silver halide precipitation. The resulting emulsion was washed with water to remove water-soluble salts and thereafter coated on a photographic paper support at a silver coverage of about 260 mg. per square foot and at a gelatin coverage of about 560 mg. per square foot. The resulting coating was thereafter exposed to the three-step exposure process of the invention and the reflection densities of the resulting exposed material were measured through a Wratten No. 15 filter to prevent continued photodevelopment for the background or $D_{min}$ areas and the image or $D_{max}$ areas of the resulting positive image. The first exposure was a low intensity image exposure for 80 seconds at an intensity of 10 foot-candles to a daylight fluorescent lamp giving an exposure of 800 foot-candle seconds. Thereafter the resulting imagewise exposed photographic element was given a second exposure which was a uniform or over-all high intensity xenon flash for $1\times10^{-4}$ seconds at an intensity of $2\times10^4$ foot-candles giving a total exposure of two foot-candle seconds. The resulting photographic material was then uniformly or over-all exposed to a daylight fluorescent bulb for 5 minutes at an intensity of 50 foot-candles to give a total exposure of 15,000 foot-candle seconds. A positive image resulted having a $D_{min}$ of 0.26 and discrimination ($\Delta D$, or $D_{max}-D_{min}$) of 0.38.

EXAMPLE 2

Several photographic elements of the type described in Example 1 were subjected to varying durations of exposure times for the first exposure of the present three-exposure process. The first exposure was an imagewise exposure to two 15-watt daylight fluorescent lamps behind an opal diffusing screen at a distance of 6 inches for an equivalent intensity of 450 foot-candles for varying times as indicated in Table I below. The second exposure was a flash exposure with a Clive Courtenay "Microflash" xenon lamp rated at 50 joules for an exposure duration of $1\times10^{-6}$ seconds at a distance of 30 inches. The third exposure or photodevelopment exposure of the present process for the various samples was effected with a daylight fluorescent bulb of approximately 60 foot-candles for 15 minutes. The results of varying the duration of the first exposure are summarized by the data set out in Table I below.

TABLE I

| Duration of first exposure | Discrimination | Background density |
|---|---|---|
| 10 seconds | 0.22 | 0.34 |
| 30 seconds | 0.27 | 0.29 |
| 90 seconds | 0.27 | 0.27 |
| 5 minutes | 0.30 | 0.26 |
| 15 minutes | 0.29 | 0.25 |
| 45 minutes | 0.30 | 0.24 |

EXAMPLE 3

Two photographic elements of the type described in Example 1 were exposed in accordance with the present three-exposure process wherein the first or imagewise exposure of one sample was carried out at 20° C. while the second was carried out at 95° C. The first or imagewise exposure was effected with a 300-watt ultraviolet lamp at a distance of 12 inches for 10 seconds at the temperatures indicated in Table II below. The high-intensity flash exposure or second exposure and the photodevelopment or third exposure of the photographic elements were carried out as described in Example 2. The discrimination ($D_{max}-D_{min}$) and reduced background density ($D_{min}$) of the positive prints resulting from the photographic elements processed in accordance with the invention are summarized by the data set out in Table II below.

TABLE II

| Temperature during first exposure (° C.) | Discrimination | Background density |
|---|---|---|
| 20 | 0.18 | 0.32 |
| 95 | 0.26 | 0.22 |

EXAMPLE 4

Several photographic elements of the type described in Example 1 were exposed in accordance with the invention wherein a wide variety of exposure conditions were utilized for the third or photodevelopment exposure step. The first or imagewise exposure was carried out with a 300-watt ultraviolet lamp for 10 seconds at a distance of 12 inches and at a temperature of 95° C. The high intensity flash or second exposure was carried out as described in Example 2. The following photodevelopment or third exposure conditions were utilized:

(a) as described in Example 2,
(b) 5 minutes to a daylight fluorescent lamp of approximately 450 foot-candles,
(c) one minute to a 300-watt ultraviolet lamp at a distance of 12 inches at 20° C.,
(d) 10 seconds to light source described in (c) above at 95° C.,
(e) 30 seconds to light source described in (c) above at 95° C.,
(f) 3 seconds to light source (c) described above at 95° C. followed by 15 minutes to light source (a) described above at 20° C.

Table III below summarizes the results obtained by utilizing the various light sources and conditions used for the third or photodevelopment exposure step.

TABLE III

| Photodevelopment | Discrimination | Background density |
|---|---|---|
| a | 0.25 | 0.28 |
| b | 0.27 | 0.30 |
| c | 0.24 | 0.34 |
| d | 0.22 | 0.25 |
| e | 0.30 | 0.28 |
| f | 0.29 | 0.26 |

EXAMPLE 5

A photographic element having coated thereon a photodevelopable, direct-print gelatino silver halide emulsion prepared with a water-soluble lead salt and cuprous iodide produces a reversal image of good discrimination when exposed in accordance with the process of the invention. Such a photographic element was prepared as follows. Three solutions were prepared having the following compositions:

| | | |
|---|---|---|
| Solution A | | |
| Sodium chloride | g | 1.85 |
| Potassium thiocyanate | g | 3.00 |
| 1.0 N nitric acid | ml | 5.60 |
| Distilled water | ml | 115.00 |
| Solution B | | |
| Potassium bromide | g | 27.6 |
| Distilled water | ml | 200.0 |
| Solution C | | |
| Silver nitrate | g | 39.0 |
| Lead nitrate | g | 0.2 |
| Distilled water | ml | 200.0 |

Solutions B and C were run simultaneously over a period of 40 minutes into Solution A. The solutions were stirred during mixing and were maintained at 72° C. The precipitate was washed by decantation with three 250 ml. portions of distilled water, combined with 50 ml. of distilled water, and 2 grams of cuprous iodide in a bottle containing ½" diameter porcelain balls. The bottle was rotated about its axis horizontally, to "ball-mill" the mixture, for an hour. 100 ml. of a 20% gelation solution was next added, the mixture was heated to 50° C., and then ball-milled for 30 minutes. Gelatin solution was added to make the volume up to 650 ml. and the gelatin concentrations 10%, and the mixture was then coated on a photographic paper support. When the resulting photographic element is exposed in accordance with the three-exposure process of the invention as described in Example 2, a positive image having a discrimination ($D_{max}-D_{min}$) of about 0.29 and a background density ($D_{min}$) of about 0.26 typically results.

The present invention thus provides a useful novel photographic method for preparting direct positive or reversal prints.

The invention has been described in considerable detail with particular reference to preferred embodiments thereof, but it will be understood that variations and modifications can be effected within the spirit and scope of the invention as described hereinabove and as defined in the appended claims.

I claim:

1. A photographic process for preparing direct-positive images with a photographic element containing a layer of a photodevelopable, direct-print silver halide composition wherein the silver halide forms latent images predominantly inside the silver halide grains which comprises imagewise exposing said silver halide composition to low-intensity light, uniformly exposing the resulting imagewise exposed silver halide composition to short-duration, high-intensity light, and thereafter uniformly exposing the resulting exposed silver halide composition to light of lower intensity than the second said exposure to effect photodevelopment of a positive image.

2. A photographic process for preparing direct-positive images with a photographic element containing a photodevelopable, direct-print silver halide emulsion layer wherein the silver halide forms latent images predominantly inside the silver halide grains which comprises imagewise exposing said silver halide emulsion layer to low-intensity light of at least about .1 foot-candle second at an intensity of less than 100 foot-candles, uniformly exposing the resulting imagewise exposed silver halide emulsion layer to short-duration, high-intensity light of at least about .1 foot-candle second at an intensity of more than 100 foot-candles, and thereafter uniformly exposing the resulting exposed silver halide layer to light of at least about .0001 foot-candle second of lower intensity than the second said exposure to effect photodevelopment of a positive image.

3. A photographic process as described in claim 2 wherein the silver halide emulsion was prepared with an organic thioether silver halide solvent present during the grain growth of the silver halide.

4. A photographic process as described in claim 2 wherein the silver halide emulsion layer includes about 3 to 100 g. of cuprous iodide per mole of silver halide and the silver halide comprises at least 70 mole percent of bromide and a maximum of 1 percent by weight of iodide based on the silver halide.

5. A photographic process as described in claim 4 wherein the silver halide was prepared at a temperature of about 65° to 85° C. in an acidic aqueous medium containing a water-soluble bromide and a water-soluble thiocyanate to form silver halide containing at least 70 mole percent of bromide and having grains with a mean projective area of about .6 to 2.5 square microns.

6. A photographic process as described in claim 2 wherein the silver halide of the silver halide emulsion was precipitated in the presence of a water-soluble lead salt.

7. A photographic process as described in claim 2 wherein the silver halide emulsion is a gelatin-silver halide emulsion, the silver halide being predominantly silver bromide and having a mean projective grain area of about .6 to 2.5 square microns.

References Cited

UNITED STATES PATENTS

| | | | |
|---|---|---|---|
| 3,178,292 | 4/1965 | Fix | 96—108 |
| 3,183,088 | 5/1965 | Hunt | 96—107 |
| 3,260,605 | 7/1966 | Sutherns | 96—107 |
| 3,271,157 | 9/1966 | McBride | 96—107 |

NORMAN G. TORCHIN, *Primary Examiner.*

RICHARD E. FICHTER, *Assistant Examiner.*

U.S. Cl. X.R.

96—108